United States Patent
Funnemann et al.

(10) Patent No.: US 7,250,599 B2
(45) Date of Patent: Jul. 31, 2007

(54) ENERGY FILTER IMAGE GENERATOR FOR ELECTRICALLY CHARGED PARTICLES AND THE USE THEREOF

(75) Inventors: Dietmar Funnemann, Taunusstein (DE); Matthias Escher, Bad Camberg (DE)

(73) Assignee: Omicron Nano Technology GmbH, Taunusstein (DE)

(*) Notice: Subject to any disclaimer, the term of this patent is extended or adjusted under 35 U.S.C. 154(b) by 273 days.

(21) Appl. No.: 10/533,598

(22) PCT Filed: Nov. 4, 2003

(86) PCT No.: PCT/EP03/12283

§ 371 (c)(1), (2), (4) Date: May 3, 2005

(87) PCT Pub. No.: WO2004/042770

PCT Pub. Date: May 21, 2004

(65) Prior Publication Data
US 2006/0016974 A1   Jan. 26, 2006

(30) Foreign Application Priority Data
Nov. 4, 2002  (DE) ............................ 102 52 129

(51) Int. Cl.
*H01J 39/05* (2006.01)
*H01J 49/44* (2006.01)

(52) U.S. Cl. .............. 250/281; 250/305; 250/306; 250/310

(58) Field of Classification Search ............... None
See application file for complete search history.

(56) References Cited

U.S. PATENT DOCUMENTS

| 4,742,223 A | 5/1988 | Kesmodel |
| 4,882,487 A * | 11/1989 | Gerlach .............. 250/306 |
| 5,185,524 A | 2/1993 | Page |
| 5,466,933 A | 11/1995 | Bryson, III et al. |

FOREIGN PATENT DOCUMENTS

| DE | 30 14 785 | 10/1981 |
| DE | 196 33 496 | 2/1998 |
| EP | 0 246 841 | 11/1987 |

(Continued)

OTHER PUBLICATIONS

Article "More on the Spherical Condenser as an Analyser I. Nonrelativistic Part", H.Z. Sar-El, Nuclear Instruments and Methods, 42, 1966, pp. 71-76.

(Continued)

*Primary Examiner*—Nikita Wells
(74) *Attorney, Agent, or Firm*—Calfee, Halter & Griswold, LLP

(57) ABSTRACT

The invention relates to an energy filter image generator for filtering electrically charged particles. The inventive energy filter comprises at least two toroidal energy analysers (30, 40) arranged one inside the other. A transfer lens device (20) is disposed between the plane of emergence (5) of the first energy analyser (30) and the plane of incidence of the second energy analyser (40), thereby making it possible to obtain the perfect energy filtered reproduction of the surface (1') of a sample on a detector (10).

20 Claims, 10 Drawing Sheets

FOREIGN PATENT DOCUMENTS

| EP | 0 293 924 | 12/1988 |
|---|---|---|
| EP | 0 470 299 | 2/1992 |
| WO | WO 00/42634 | 7/2000 |
| WO | WO 01/61725 | 8/2001 |

OTHER PUBLICATIONS

Article "Time-of-flight electron spectrometer for voltage measurements on integrated circuits", AR Dinnis et al, J. Vac. Sci. & Technol. B, vol. 11, No. 6, Nov./Dec. 1993, 2452-55.

Article "Imaging Properties of Electrostatic Energy Analyzers with toroidal Fields", B. Wannbert et al, J. Electron Spectroscopy & Related Phenomena, 9, 1976, 111-127.

Article "Novel design of a 'spherical' electron spectrometer", K. Jost, J. Phys. E: Sci. Instrum., vol. 12, 1979, 1006-1012.

Article "Energy-Filtered Imaging with Electrostatic Optics for Photoelectron Microscopy", B.P. Tonner, Nuclear Instruments and Methods in Physics Research A291, 1990, 60-66.

Article "Resolution Improvements for Hemispherical Energy Analyzers", T. Sagara, et al., Review of Scientific Instruments, vol. 71, No. 11, Nov. 2000, pp. 4201-4207.

International Search Report from PCT/EP03/12283.

International Search Report (PCT/EP 03/12283).

International Preliminary Report on Patentability (Translation). 0182 WO—PCT/EP2003/012283.

Dinnis A R et al: Time-of-Flight Electron Spectrometer for Voltage Measurements on Integrated Circuits, Journal of Vacuum Science and Technology: Part B, vol. 11, No. 6, Nov. 1, 1993, American Institute of Physics. New York, US.

* cited by examiner

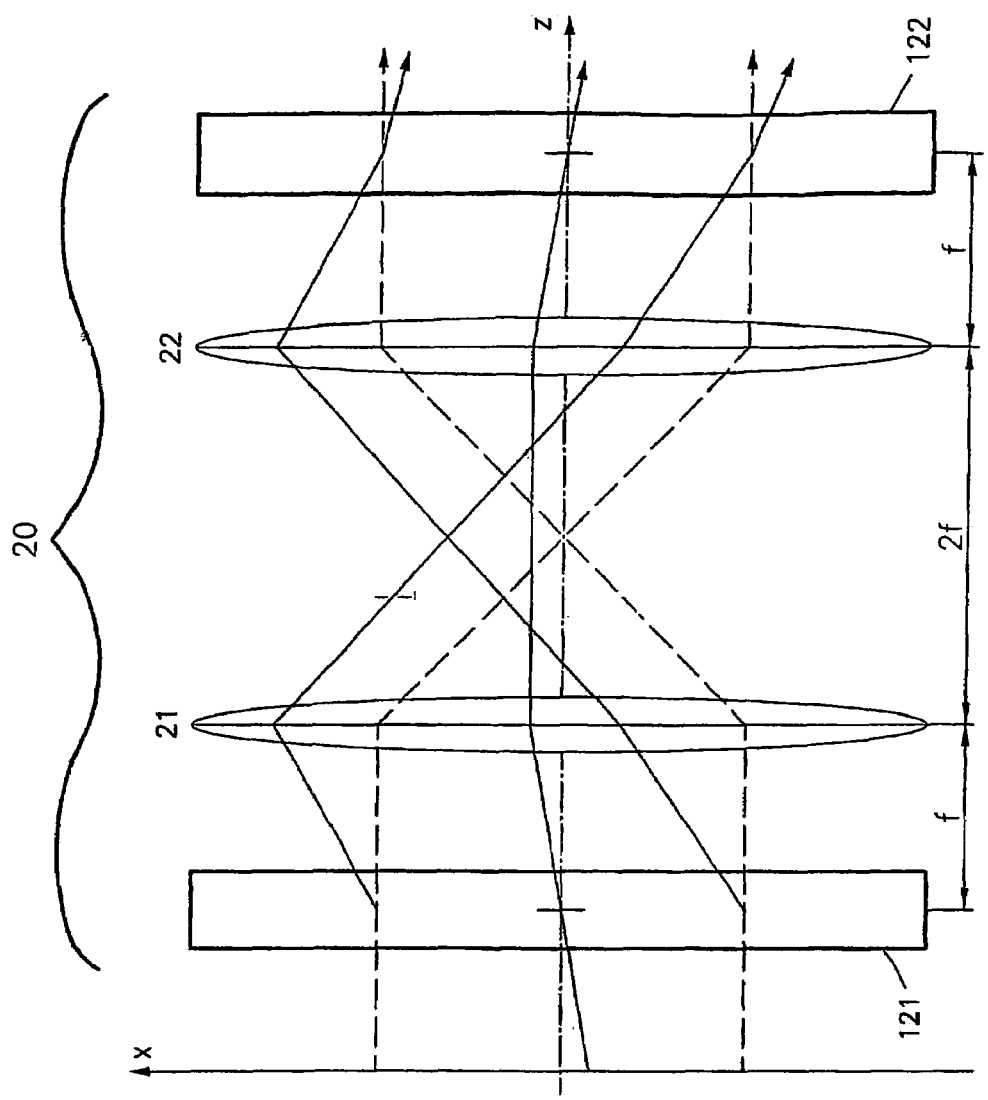
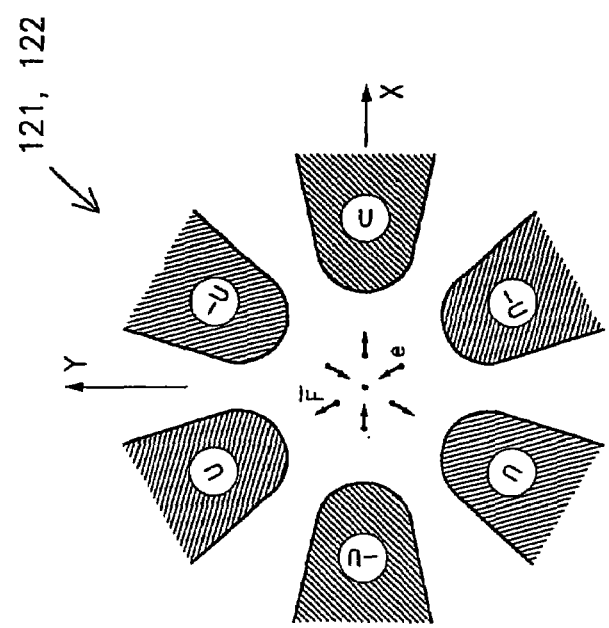
Fig.9b
Fig.9a

ENERGY FILTER IMAGE GENERATOR FOR ELECTRICALLY CHARGED PARTICLES AND THE USE THEREOF

RELATED APPLICATIONS

This application is a national stage application based on International Application No. PCT/EP2003/012283, filed Nov. 4, 2003, which claims priority from German application No. 102 52 129.8 filed Nov. 4, 2002.

BACKGROUND OF THE INVENTION

The invention pertains to an image-generating energy filter for electrically charged particles such as electrons and ions with at least two toroidal energy analyzers arranged in a row, where at least one energy analyzer has a diaphragm in its entrance plane and another diaphragm in its exit plane. The invention also pertains to the use of these image-generating energy filters.

The diaphragms in the entrance and exit planes can be slit diaphragms or circular diaphragms perpendicular to the associated energy-dispersive plane.

The term "energy filter" is understood to mean preferably an imaging or image-generating energy filter. The use of imaging filters is especially advantageous when the image fields being processed in parallel contain more than 100×100 pixels. The recording times are then much shorter than those of a spectrometer, which scans the sample sequentially.

Energy filters are used in, for example, photoelectron spectroscopy, which is one of the most important methods of the quantitative elementary analysis of surfaces. Measuring the energy distribution of photoelectrons with high local resolution is called spectromicroscopy. There are essentially two different methods which can be used to achieve a high degree of local resolution.

In the first variant, the sample is scanned by a focused photon beam, and the energies of the photoelectrons coming from the individual emission spots thus defined are analyzed.

In the second variant, the photon beam is focused just long enough to illuminate the visual range of the objective lens. Electron-optical means are then used to produce a magnified image of the intensity distribution of the generated photoelectrons.

To derive a map of the distribution of the elements or of the chemical bonds, the kinetic energies of the photoelectrons must be analyzed. Various techniques have been developed to accomplish this in transmission-electron microscopy. Here, too, there are essentially two different principles:

There are microscopes which use all of the electrons to generate an image. A small percentage of the electrons pass through an energy analyzer to generate a spectrum of a portion of the image. In another part of the microscope, only a narrow energy band is processed, but a complete image is transported through the energy analyzer.

The electrons are filtered by electrostatic or magnetic devices, which allow only the electrons with a certain energy to pass through. The intensity of the resulting beam reflects the concentration of a chemical component present on the surface of the sample. In this method, it is important for the local resolution not to deteriorate as the beam passes through the monochromator.

Several different energy analyzers have been developed to perform this imaging function. Because of its good transmission and energy resolution, the hemispherical analyzer has become widely accepted in commercial devices for energy analysis not requiring image quality.

The possible imaging properties of electrostatic energy analyzers were studied many years ago on the basis of analyzers with general toroidal fields (B. Wannberg, G. Engdahl, A Sköllermo: Imaging properties of electrostatic energy analyzers with toroidal fields, *J. Electron Spectr. Rel. Phenomen.* 9 (1976), pp. 111-127). For a toroidal potential, the radius of curvature in a first direction is different from that in a second direction perpendicular to the first. A spherical capacitor with a ratio of 1 between the radii is included as a special case in this general description. A cylindrical capacitor is curved in only one direction, and the ratio between its radii is zero. Some spectrometers make it possible to adjust the transition between the field forms in a continuously variable manner, as described, for example, in K. Jost: Novel Design of a spherical electron spectrometer, *J. Phys. E.: Sci. Instr.*, 12, 1979, pp. 1006-1012.

An electron microscope with an energy filter comprising a spherical analyzer of hemispherical design is known from EP 0,293,924 B1. To improve the imaging quality of the energy filter, a complicated lens system is set up in front of the entrance slit so that the arriving electron beams are as close to perpendicular as possible. For electrons which start at the mean path radius $r_0=x_0$, it should be true that $\alpha_0=-\alpha_1$, where $\alpha_0$ stands for the angle at the entrance to the energy filter and $\alpha_1$ for the angle at the exit.

It is claimed that the entrance angles of these electrons are transferred exactly to the exit angles regardless of their energy.

To take advantage of this property, a magnified image of the sample is placed not at the entrance slit of the analyzer but rather at the focal point of a lens, which is set up in front of the slit diaphragm of the analyzer. Thus the position of the image is transformed into angles. The entrance slit diaphragm is placed on the image side of the lens at the focal point.

The exit slit of the analyzer selects the desired energy range. Another lens behind the analyzer reconstructs a now energy-filtered local image from the transmitted angle image. This can be magnified further and made visible on a screen with the help of an intensity amplifier, such as a microchannel plate.

An electron spectrometer with a similar arrangement is described in EP 0,246,841 B1. A local resolution of down to 2.5 μm is obtained with this energy analyzer of the toroidal capacitor type, which has a lens system in front and another behind.

It was overlooked, however, that the equation $\alpha_1=-\alpha_0$ is usually only a rough approximation. In *Nucl. Instr. Methods* A291 (1990), pp. 60-66, it is shown that the entrance and exit angles also depend on the entrance and exit locations. The entrance and exit angles will differ significantly from each other when the entrance and exit positions are different. It is then true that $(\tan \alpha_0):x_0=-(\tan \alpha_1):x_1$.

The aberrations increase with the size of the magnified image field, that is, with the possible difference between $x_1$ and $x_0$. The following example can illustrate the magnitude of these defects:

In the case of a visual field with a diameter of 4 mm, where, for example, $x_0=122$ mm and $x_1=126$ mm, and for an acceptance angle of $\alpha_0=5°$, we can calculate an exit angle of $\alpha_1$ of 5.16°. This is a 3% deviation from the incidence angle. In the case of a visual field with a radius of 100 μm, this results in an imaging error of 3 μm at the edge of the image field.

Electrons with the same entrance position but different entrance angles also have different exit positions and different exit angles according to:

$$\tan \alpha_1 = \tan \alpha_0 \left(1 - \frac{2}{\cos^2 \alpha_0}\right)^{-1}.$$

This is described in, for example, T. Sagara et al., Resolution Improvements for hemispherical energy analyzers, Rev. Sci. Instr. 71, 2000, pp. 4201-4207.

In another example, a hemispherical analyzer is used in a different operating mode. Here the potentials are selected so that the electrons travel along a hyperbolic path in a field which rises with the square of the-radius.

U.S. Pat. No. 5,185,524 describes an electrostatic analyzer with spherical mirrors. The electrons pass into the inner sphere through slits and are brought back out through the inner sphere to a focal point by an opposing field. Both the object and the image are located inside the inner sphere.

The disadvantages of this arrangement are described in Nucl. Instr. Methods 42, 1966, pp. 71-76. Large slits are present in the inner sphere at locations where the cross section of the beam is not small. Pieces of netting are attached at these points to ensure the required spherical potential. Only a portion of the field passes through the mesh, which limits the local resolving power. Each mesh opening represents a small diverging lens. Another disadvantage of using netting in the path of the beam is the production of secondary electrons, which leads to an increase in background noise and thus reduces the displayable contrast. The energy-selecting slit is located in the electrical field between the hemispheres and is therefore difficult to reach and adjust. The voltages which must be applied to the outer sphere are much higher than those required for the conventional hemispherical analyzer.

In this design, as also in the preceding one, there are inherent aberrations, which can be attributed to the merely two-fold symmetry of the instrument's construction.

DE 196 33 496 A1 describes a monochromator for electron microscopy with mirror symmetry. The design in the form of a Ω avoids second-order aberrations, and even some of the third-order aberrations disappear. One of the essential criteria for the selected design was the avoidance of an intermediate focus. The goal here is to make it possible to monochromatize a primary electron beam of small diameter and high current density. This requirement leads to a complicated mechanical solution. The design consists of eight toroidal sectors, which must be adjusted very precisely with respect to each other. The device is therefore very costly to make and very time-consuming to adjust.

A similar mirror-symmetric arrangement of monochromators is selected in EP 0,470,299 A1. This arrangement also lacks an intermediate lens, but it does have a straight connecting tube. The energy-selecting slit is located in the plane of symmetry. No provisions are made for generating images in this case, either.

An energy filter consisting of a complementary opposing pair of 90° sectors, which are arranged with respect to each other in such a way that they form an "S", is known from U.S. Pat. No. 5,466,933. An aperture diaphragm is set up between the two sectors. With this energy filter, an image of the incoming parallel electron beam is produced at the exit from the sector arrangement.

Although this arrangement using parallel electron beams does make it possible to obtain a high-contrast image at the exit of the energy filter, the intensity present at the exit is extremely low. The intensity can be increased by allowing electrons with an entrance angle ao not equal to zero to enter as well, but then the pixels are smeared and the contrast is reduced.

WO 01/61,725 A1 describes an emission electron microscope, which contains an image-generating beam path consisting of an electron-optic imaging system, which subjects the electron beam to a parallel shift and analyzes its energy. It consists of two spherical energy analyzers with a lens inserted between them. This lens is located at the focal point of the two analyzers. An intermediate image of the sample or the angle image of the sample is placed at the center of this lens. Because the magnification of field lenses is positive, aberrations which arise on passage through the first deflector are not corrected. This document does not mention or discuss the correction of aberrations.

DE 3,014,785 A1 describes a double monochromator for charged particles, which contains a delay lens in the form of slit diaphragms between the two monochromator subunits. The monochromator operates without loss of energy resolution at higher intensities than was possible in the past. No lens which might improve the imaging properties of the system is mentioned. Slit diaphragms are also described in U.S. Pat. No. 4,742,223. The imaging properties of the system are not discussed.

U.S. Pat. No. 5,448,063 describes an image-generating, mirror-symmetric energy filter, which compensates only for $2^{nd}$ and $3^{rd}$-order aberrations. This defect correction is achieved only by the use of complicated equipment, which includes additional hexapole fields.

SUMMARY OF THE INVENTION

The task of the invention is therefore to create an image-generating energy filter with minimal aberration, which guarantees both a high-contrast image with high local resolution and high intensity at the exit.

This task is accomplished by an energy filter which is characterized in that a transfer lens device with negative lateral magnification $V_L$, negative angle magnification $V_W$, image rotation by the angle $\gamma=\beta-180°$, and a telescopic beam path is placed between the exit plane of the first energy analyzer and the entrance plane of the second energy analyzer, where all the deflection angles φ of the transfer lens are the same, and where its energy-dispersive planes (33, 43) are rotated around the angle β with respect to each other.

The energy analyzers are rotated around the axis of the transfer lens device.

A "telescopic beam path" is understood to be a beam path in which the various clusters of parallel beams are converted to a single parallel beam cluster regardless of their angles of incidence. The angle γ stands for the degree to which the image is rotated from its inverse position. This inverse position is achieved by the use of, for example, electrostatic lenses.

The advantage of the energy filter is that it is not mandatory to work with particle beams arriving in perpendicular fashion at the entrance plane of the first energy analyzer; that is, the entrance angle $\alpha_0$ can be allowed to be unequal to zero, which means that a high-contrast image of high intensity can be produced at the exit of the energy filter. The aberrations present at the exit from the first energy analyzer, especially the second-order aberrations, are transformed by the transfer lens device and projected onto the entrance plane of the second energy analyzer in such a way that that these aberrations are completely eliminated when the charged particles travel through the second energy analyzer.

The image quality of the energy filter is limited essentially only by the quality of the transfer lens device.

The transfer lens device is preferably designed so that, in the energy-dispersive plane, it projects the intermediate image $ZB_1$ present at the exit plane of the first energy analyzer with a linear magnification of $$V_L = \frac{ZB_2}{ZB_1} < 0$$

and with an angular magnification of $$V_W = \frac{\alpha_2}{\alpha_1} < 0, \text{ where } V_W V_L \sqrt{\frac{E_2}{E_1}} = 1,$$

rotated around the angle $\gamma=\beta-180°$, onto the entrance plane of the second energy analyzer as an intermediate image of the size $ZB_2$, where $\alpha_1$ is the exit angle of the charged particles from the exit plane of the first energy analyzer; $\alpha_2$ is the entrance angle to the entrance plane of the second energy analyzer; $E_1$ is the kinetic energy of the charged particles in the exit plane of the first energy analyzer; $E_2$ is the kinetic energy of the charged particles in the entrance plane of the second energy analyzer, and where the charged particles travel through a telescopic beam path in the transfer lens device.

For an electrostatic transfer lens device, $\beta=180°$ and $V_L$ and $V_W$ are negative. For a magnetic transfer lens device, $V_L$ and $V_W$ are also negative, but the image can be subject to rotation, which means that it is necessary to select $\beta \neq 180°$.

The energy analyzers and the transfer lens device are preferably set up with point symmetric around the center Z of the transfer lens device. This means that the energy analyzers have the same construction dimensions and that $V_L=-1$ and $V_W=-1$.

The energy analyzers can also have different construction dimensions, as a result of which an arrangement with quasi-radial symmetry is created, in which $V_W$ and $V_L$ are less than 0.

$V_W=V_L=-1$ can be obtained by adjusting the radii and the pass energies appropriately to each other.

Within the scope of the invention, the choice of the type of deflection fields used for the analyzers is essentially free. Magnetic fields, either permanent or generated by electrical current, can be used, but electrostatic fields are especially preferred.

The toroidal energy analyzers are preferably sectors of a sphere or cylindrical analyzers, especially with a deflection angle of more than 90°.

Hemispherical analyzers with deflection angles of $\phi=180°$ are especially preferred, because these have an especially high energy dispersion at their exit.

In a spherical field, in which the potential energy of the particle is $\sim 1/r$, the charged particles move along closed elliptical paths. All of the particles which start at one point, even though of different energies and even of different angles, reach their exact original position again after a circuit of 360°. As a result, there are no aberrations at the exit. In a closed spherical analyzer of this type, the two energy-dispersive planes of the two hemispheres would by definition enclose the angle $\beta=0$. After traveling 180°, the particles with different energies reach their maximum distance from each other. If an aperture which does not disturb the radial field is placed here, only the particles of the desired energy are allowed to pass through. Nevertheless, in a closed spherical analyzer of this type, there is no room to put an entrance lens and a detector, for example, or a transfer lens.

In the case of two hemispherical analyzers which are arranged with respect to each other in such a way that their energy-dispersive planes are rotated around the angle $\beta$, the imaging properties of the transfer lens device makes it possible to retain the properties of a complete spherical analyzer, so that defect-free images will be obtained at the exit of the energy filter. The transfer lens device ensures that the paths are exact images of each other, the only difference being that the entrance point to the first hemispherical analyzer is separated in space from the exit point of the second hemispherical analyzer.

The effect thus obtained is that of a spherical capacitor. It is known that non-relativistic particles travel along closed, periodic elliptical paths. The angles and positions are the same after a complete circuit. This is independent of the starting position, of the entrance angle, and of the energy of the charged particles.

The energy-dispersive plane of the hemispherical analyzers is preferably rotated by an angle of $\beta=180°$ around the axis of the transfer lens device, so that the beam path has the shape of an "S". This arrangement offers the advantage that an especially simple transfer lens device can be used.

For practical reasons, the angle $\beta$ between the dispersion planes is preferably within the range between 5° and 355°, especially between 15° and 340°.

The energy analyzers can be of different designs; if so, the design of the transfer lens device must be modified accordingly. In the case of different energy analyzers, e.g., different pass energies $E_1$ and $E_2$, the lateral magnification and the angular magnification must be adjusted to produce the desired intermediate image on the entrance plane of the second energy analyzer. In the design of the transfer lens arrangement, therefore, it is necessary to take in the account the Lagrange-Helmholtz equation $$ZB_1 \cdot \alpha_1 \cdot \sqrt{E_1} = \text{const.} = ZB_2 \cdot \alpha_2 \cdot \sqrt{E_2}.$$

From a cost standpoint, however, it is advantageous to use identical energy analyzers and to work with the same pass energies. In this case, the lateral magnification of the transfer lens device is $V_L=-1$, and the angular magnification of the transfer lens device is $V_W=-1$.

The transfer lens device preferably comprises at least one electrostatic lens, especially an electrostatic tube lens, which is used especially in conjunction with two hemispherical analyzers with energy-dispersive planes which are preferably rotated with respect to each other by the angle of $\beta=180°$.

The transfer lens device can comprise at least one magnetic lens. Magnetic lenses offer the advantage that they produce smaller aberrations than electrostatic lenses. They are therefore preferred in cases where, because the energy analyzers are rotated by the angle $\beta$ from each other, the intermediate image $ZB_1$ must also be projected with a rotation around the angle $\gamma=\beta-180°$.

The transfer lens device preferably has at least two lenses.

It is advantageous to locate the exit plane of the first energy analyzer at the focal point of the first lens and to locate the entrance plane of the second energy analyzer at the focal point of the second lens, where 2F stands for the distance between the two lenses and F stands for the focal distance of the two lenses.

The transfer lens device can also have at least one electrostatic or magnetic multipole lens. Multipole lenses offer the advantage that they can provide an image without any spherical aberrations. A multipole lens is set up between the two energy analyzers in such a way that a radially symmetric arrangement is obtained.

According to one possible use of the energy filter, the filter is placed in the imaging beam path of an image-generating electron-optic system. The task of the energy filter is to select electrons of certain energies from the beam path through appropriate adjustment of the diaphragms of the energy filter. It is irrelevant whether an intermediate image of the sample to be studied, the Fourier-transformed intermediate image, or some other intensity distribution of the imaging beam path is sent to the entrance slit of the energy analyzer. The energies of these charged particles and energy bandwidth of the detected beam path can be determined and varied by changing the energy window.

One of the preferred uses of the energy filter is in electron microscopy. Here the energy filter is used to produce an image of the electrons emitted and back-scattered by an object. These electrons have by nature a wide energy spectrum. The contrast can be improved by using electrons from a narrow energy band. By selectively setting the energy window, a succession of specific signals can be selected out and amplified, while the others can be attenuated. It is therefore possible to emphasize a certain set of data.

Another preferred use of the energy filter is in time-resolved measuring instruments. The advantage of the energy filter is that even differences in the times of flight which occur in the first energy analyzer are eliminated by the transfer lens device and passage through the second energy analyzer.

BRIEF DESCRIPTION OF THE DRAWINGS

Exemplary embodiments of the invention are explained in greater detail below on the basis of the drawings:

FIG. 9 shows a transfer lens device with multipole lenses; and

DETAILED DESCRIPTION OF THE INVENTION

Figure 1:
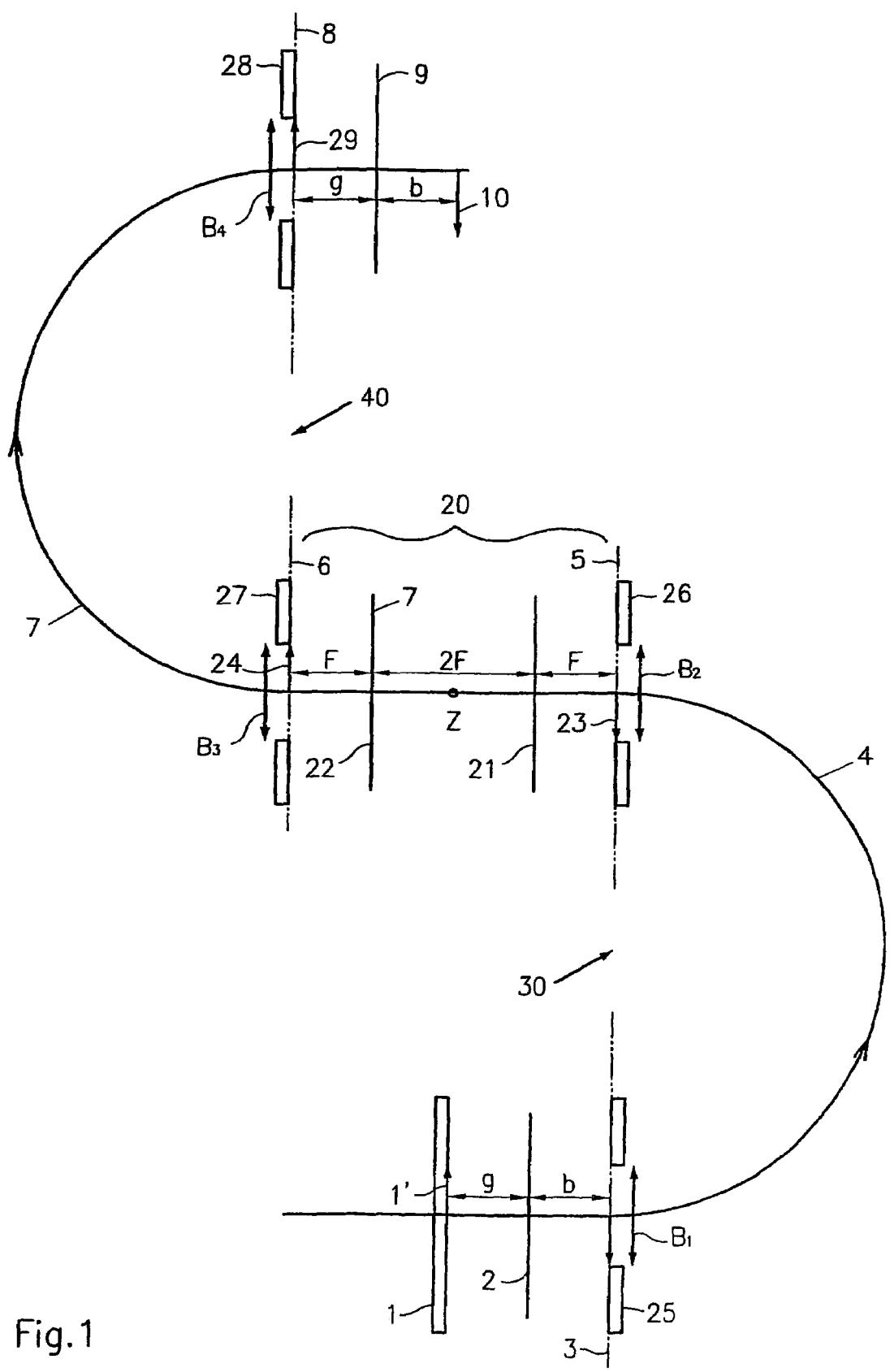
FIG. 1 shows a schematic diagram of an energy filter with two hemispherical analyzers.

FIG. 1 shows a schematic cross-sectional diagram of an energy filter, which has two hemispherical analyzers 30 and 40, between which a transfer lens device 20 is located. The two energy analyzers 30, 40 together with the transfer lens device 20 are set up in such a way that the beam path lies in a plane and has the shape of an "S".

The overall arrangement has radial symmetry with respect to the center Z of the transfer lens device 20; the radial symmetry is two-fold.

The electrons curve to the left in the first energy analyzer 30, and after they have passed through the transfer lens device 20, they curve to right in the second energy analyzer 40. This means that the two energy-dispersive planes 33, 43 of the two energy analyzers are rotated by the angle $\beta=180°$ with respect to each other (see FIG. 4).

FIG. 1 shows only the center beam paths 4 and 7 of the electrons in the first and second energy analyzers. The energy filter has image-generating properties while avoiding aberrations of the second and higher orders.

The surface 1' of the sample 1 is a certain distance g from the first lens system 2, which forms an image of the electrons emerging from the surface 1' on the entrance plane 3 of the first hemispherical analyzer 30.

The object distance g can be the same as the focal distance of the lens system 2, so that the image distance b is approximately equal to infinity. In this case, the entrance plane 3 of the first energy analyzer 30 is preferably located in the image-side focal plane of the lens system 2.

Figure 3:
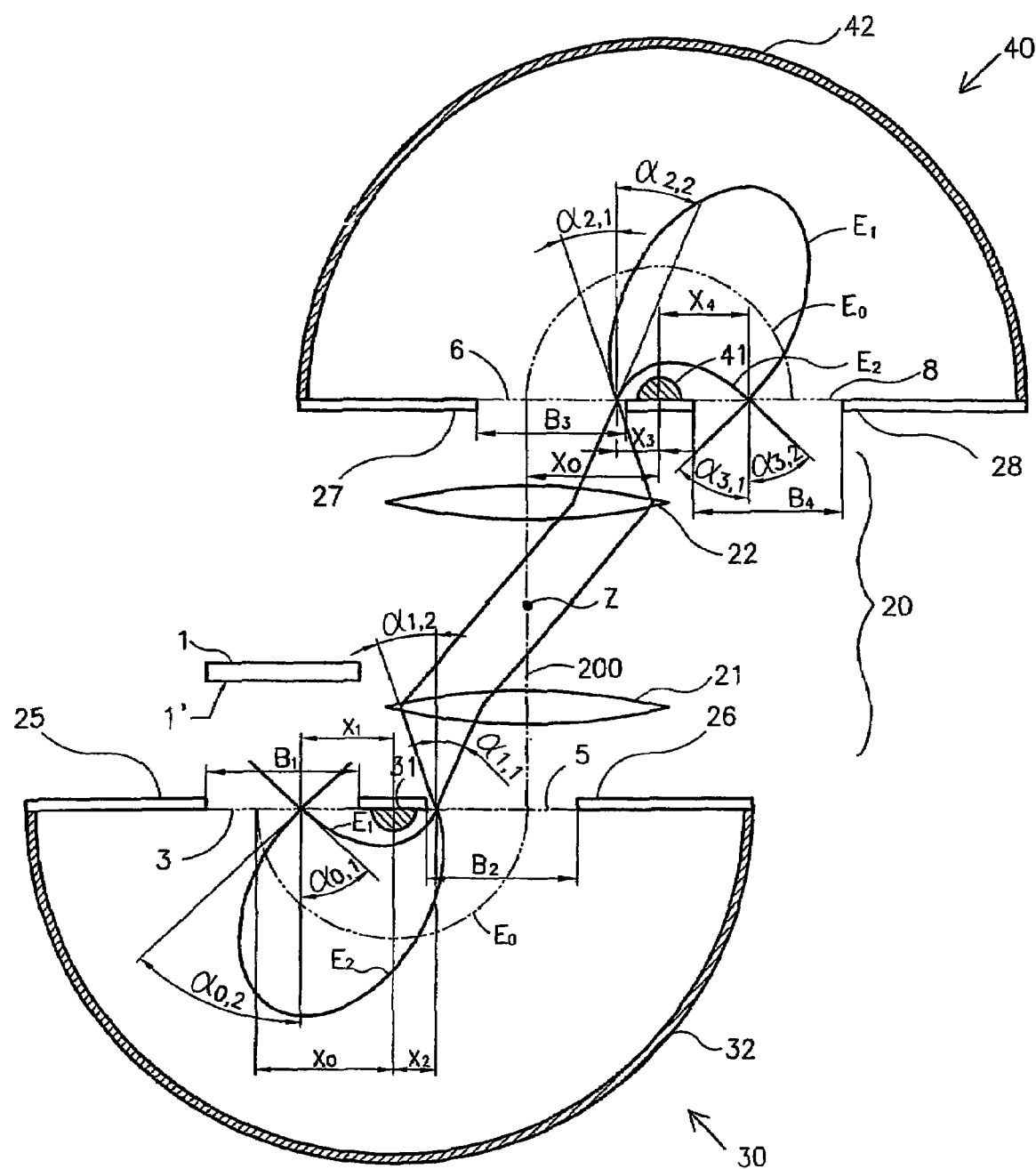
FIG. 3 shows an embodiment of the arrangement shown in FIG. 1.

In the entrance plane 3 there is a first energy-defining slit diaphragm 25, which is perpendicular to the plane of the drawing and has the width $B_1$ (see also FIG. 3).

The hemispherical analyzer 30 forms an image of the electrons entering through the slit diaphragm 25 with aberrations in the exit plane 5, where a second slit diaphragm 26 with the width $B_2$ is located.

Because the electrons enter the slit diaphragm 25 in the entrance plane 3 at various angles $\alpha_0$, they also exit at different exit angles $\alpha_1$ upon leaving the deflection field of the first energy analyzer.

The second slit diaphragm 26 is perpendicular to the plane of the drawing in which the linear focus of the astigmatic intermediate image $ZB_1$ 23 lies. The energy dispersion occurs in the plane of the drawing. This dispersion is defined as the deviation from the central beam path 4 by a value which is proportional to the energy deviation. By changing the width $B_2$ of the slit (see also FIG. 3), it is possible to adjust or to change selectively the energy bandwidth of the electrons let through by the slit diaphragm 26. As a result, the only electrons which reach the intermediate image $ZB_1$ 23 are those which lie within this energy bandwidth. The electron beam is monochromatic as a result.

A transfer lens device 20 is set up behind this exit plane 5. This device consists of two identical converging lenses 21 and 22 and forms an image of the first intermediate image 23 produced in the exit plane 5 as an inverted second intermediate image $ZB_2$ 24, that is, $V_L=-1$, at the entrance plane 6 of the second energy analyzer 40.

The transfer lens device 20 not only inverts the intermediate image $ZB_1$ 23 on the entrance plane 6 but also inverts the angles, so that the entrance angles $\alpha_2$ in the entrance plane 6 of the second energy analyzer 40 are described by $\alpha_2=-\alpha_1$.

The aberrations are eliminated in the second energy analyzer 40 as a result of the inversion of the astigmatism of the intermediate image $ZB_1$ 23 in conjunction with the inversion of the path curvature present in the first energy analyzer 30. An energy-filtered, stigmatic image 29, which can be projected by the lens system 9 onto a detector 10, is thus created in the exit plane 8.

In this embodiment, the second energy analyzer 40 also has a slit diaphragm 27 of width $B_3$ in the entrance plane 6 and a slit diaphragm 28 of with $B_4$ in the exit plane 8.

If the distance of the surface 1' of the sample 1 or of a magnified or reduced image is equal to the focal distance of the lens system 2, the distance of the lens system 9 from the exit plane 8 will also be equal to the focal distance, and the distance to the detector 10 will be equal to the focal distance of the lens system 9.

Diffraction images instead of real images are then present at the entrance and exit planes of the two energy analyzers 30, 40. If the lens systems 2 and 9 are operated asymmetrically, it is possible to use the energy filter to obtain a diffraction image of sample 1 without any aberrations of the second and higher orders. It is said that the lens systems are operated "asymmetrically" when either the lens system 2 projects the surface of the sample onto the entrance plane 3 and the lens system 9 is adjusted in such a way that the intermediate image 29 is situated at the focal distance of the lens system 9, or conversely the lens system 2 is adjusted in such a way that the sample surface (or its intermediate image) lies in the focal plane of the lens and simultaneously the lens system 9 projects the plane 8 sharply onto the detector 10.

The diffraction image of the sample is then projected by the lens system 2 onto the entrance plane 3. This diffraction image is energy-filtered and ultimately arrives at the exit plane 8. From there it is projected by the lens system 9 onto the detector 10.

Figure 2:
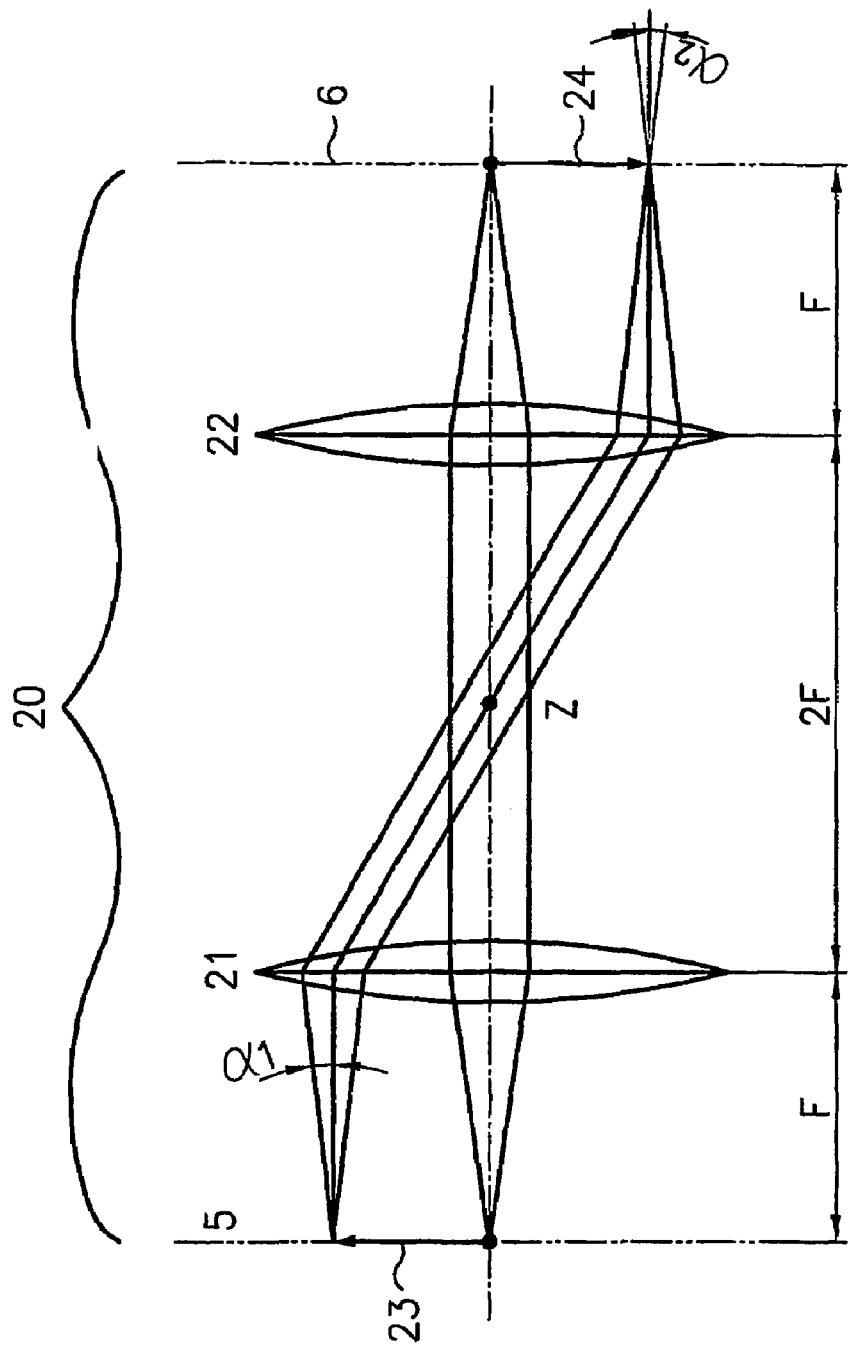
FIG. 2 shows a schematic diagram of a transfer lens device.

FIG. 2 shows a schematic diagram of the beam path in the transfer lens device 20. The two identical electrostatic converging lenses 21, 22 have an F-2F-F arrangement, where F is the focal distance of the lenses 21, 22. On the basis of this lens arrangement, the first intermediate image $ZB_1$ 23 in the exit plane 5 with the lateral magnification $V_L = -1$ and the beams with the angular magnification $V_W = -1$ are projected onto the entrance plane 6 as a second intermediate image $ZB_2$ 24. The beam path is radially symmetric and telescopic.

When other types of lenses are used, e.g., electron-optic cylindrical lenses, the angular and lateral magnifications can also be +1 in the non-dispersive plane.

FIG. 3 shows a possible embodiment of the arrangement illustrated schematically FIG. 1 with three possible electron paths $E_0$, $E_1$, and $E_2$. A cross section through the energy-dispersive planes is shown.

The electrons start from the surface 1' of the sample 1, pass through the slit diaphragm 25 of width $B_1$, and enter the first hemispherical analyzer 30, in which an electrostatic deflecting field is applied between the inner shell 31 and the outer shell 32.

When the electrons enter the slit diaphragm 25 at a right angle, as they do at point $X_0$, they describe a path $E_0$, which describes a semicircle in each of the first and second hemispherical analyzers.

Because the path $E_0$ meets the axis 200 of the transfer lens device 20, the electrons are also projected onto point $X_0$ of the slit diaphragm 27 of the second hemispherical analyzer 40, and the path along which they travel in the second hemispherical analyzer is radially symmetric to point Z.

The electrons on path $E_1$ start at point $X_1$ of the slit diaphragm 25 of the first hemispherical analyzer 30 with a different energy and a different entrance angle $\alpha_{0,1}$, whereas the electrons of path $E_2$ start at point $X_1$ with the entrance angle $-\alpha_{0,2}$. The electrons are deflected to point $X_2$ in the second slit diaphragm 26, describing elliptical paths in both cases. The exit angles are $\alpha_{1,1}$ and $\alpha_{1,2}$, where $|\alpha_{1,1}|=|\alpha_{1,2}|$ was selected in this example.

The pixel $X_0$ of the first intermediate image $ZB_1$ in the slit diaphragm 26 is projected with the lateral magnification $-1$ and with the angular magnification $-1$ onto the plane 6 at point $X_3$ as a pixel of the second intermediate image $ZB_2$. For the angles we therefore have $\alpha_{1,2}=-\alpha_{2,2}$ and $\alpha_{1,1}=-\alpha_{2,1}$.

In the second energy analyzer 40, an equally intense electrostatic deflecting field is applied between the inner shell 41 and the outer shell 42, so that the electron paths $E_1$ and $E_2$ have elliptical courses which correspond to the elliptical paths in the first energy analyzer 30. The electrons exit at point $X_4$ at the angles $\alpha_{3,1}$ and $\alpha_{3,2}$, which correspond in turn to the angles $\alpha_{0,1}$ and $\alpha_{0,2}$. The deviations of the angles are $\alpha_{1,1}$ and $\alpha_{1,2}$ are compensated by the second pass, i.e., by the pass through the energy analyzer 40. It is also true with respect to the point $X_4$ that $X_4=X_1$. An energy-filtered image of the sample 1 is thus obtained without aberration in the plane of the slit diaphragm 28.

Figure 4:
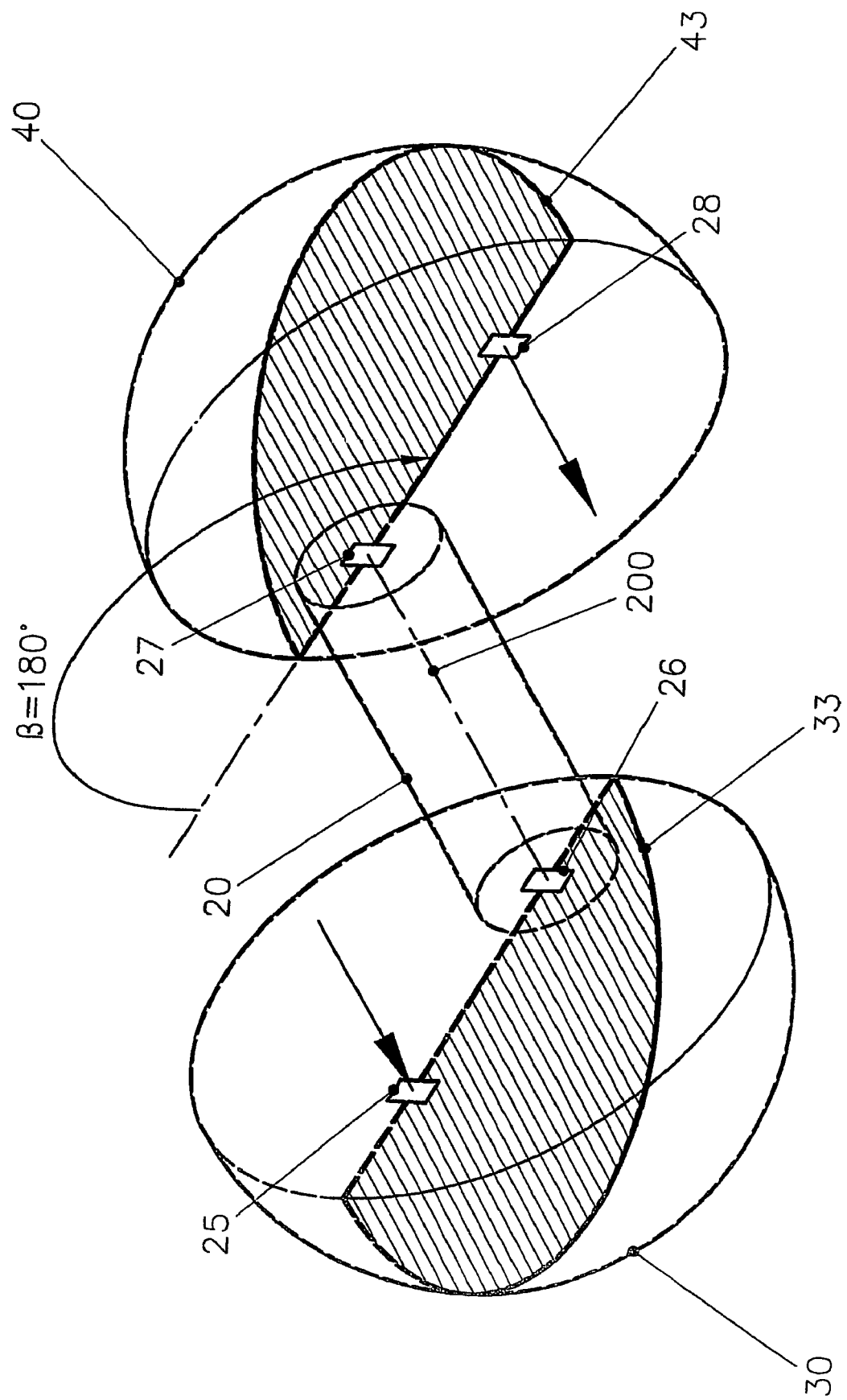
FIG. 4 shows a perspective view of the embodiment according to FIG. 3.

FIG. 4 shows a perspective view of the embodiment shown in FIG. 3. The energy-dispersive planes 33 and 43 and the slit diaphragms 25, 26, 27, and 28 in the hemispherical analyzers 30, 40 are illustrated. The second hemispherical analyzer 40 is rotated by the angle $\beta=180°$ around the axis 200 of the transfer lens device 20, which axis passes through the slit diaphragm 27.

Figure 5:
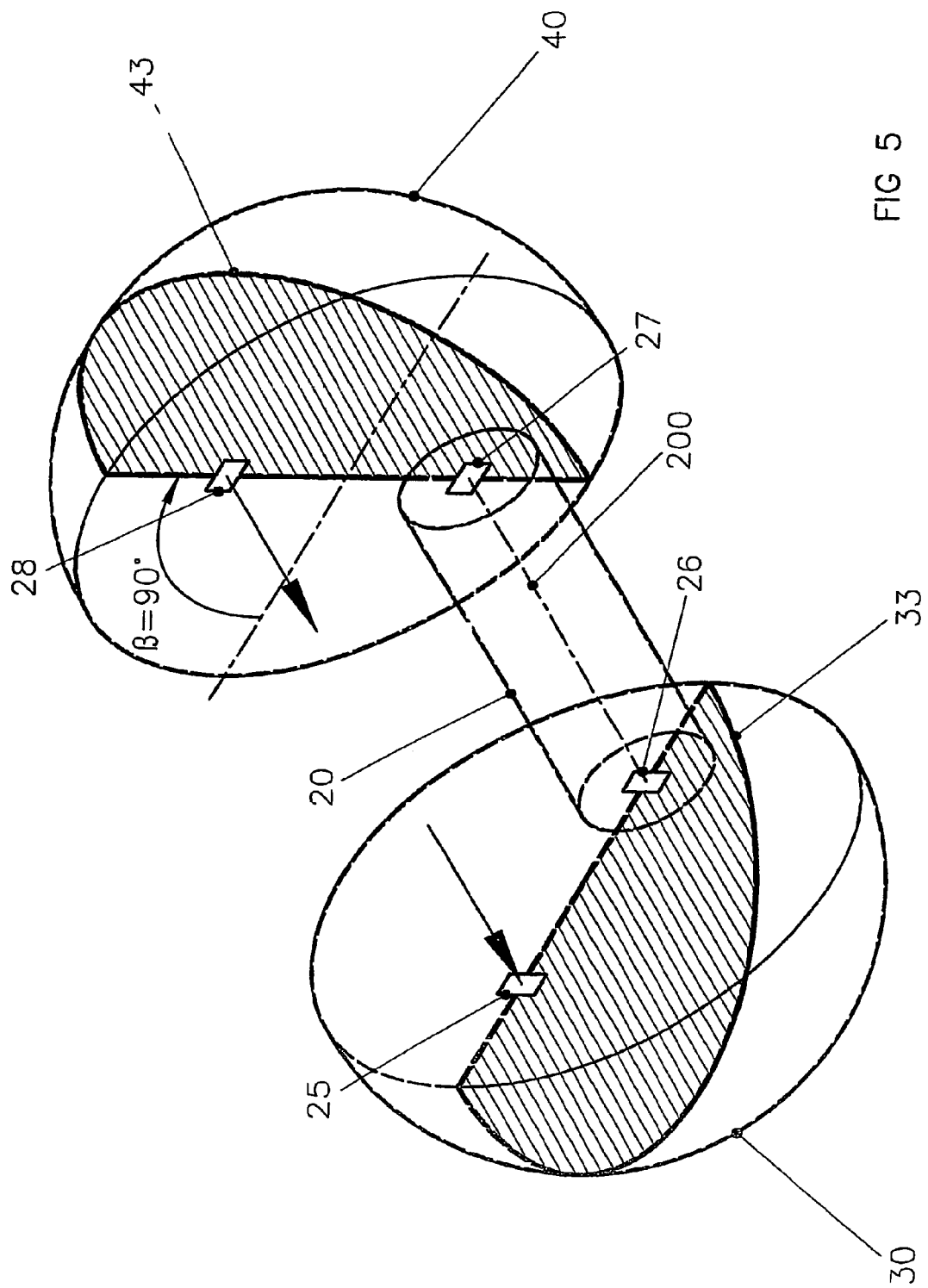
FIG. 5 shows another embodiment, which differs from that shown in FIG. 4 by a different angle of rotation.

FIG. 5 shows another embodiment, in which the second hemispherical analyzer 40 is rotated by the angle of only $\beta=90°$ around the axis 200 passing through the slit diaphragm 27.

Figure 6:
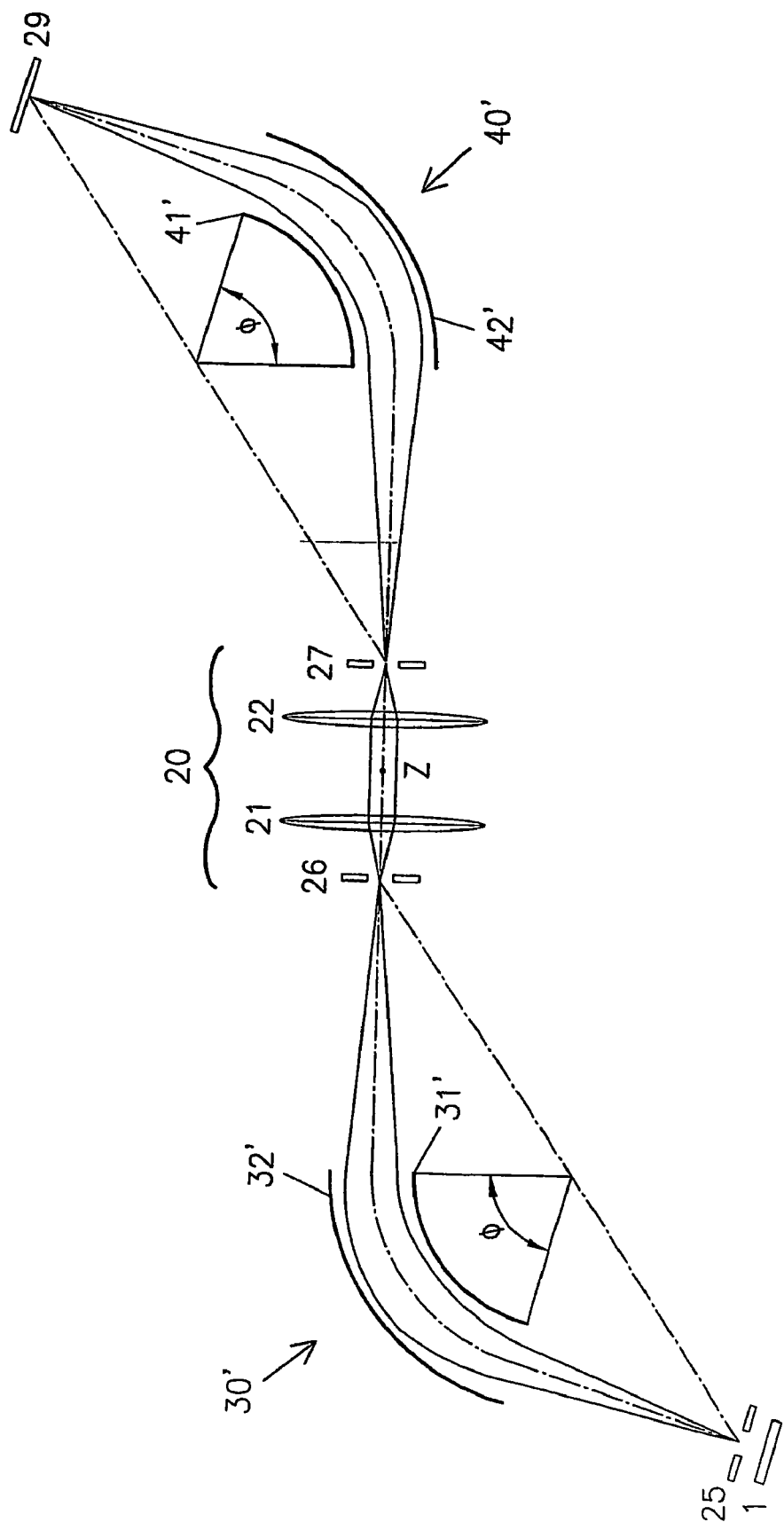
FIG. 6 shows a schematic diagram of another embodiment in which spherical sectors are used as energy analyzers.

FIG. 6 shows an embodiment corresponding to that of FIG. 3, where, instead of the hemispherical analyzers 20, 30 [Sic; →30, 40-Tra], spherical sectors 20', 30' [Sic; →30', 40'-Tra] are used, which have inner shells 31', 41' and outer shells 32', 42' with deflection angles of $\phi \leq 180°$. The arrangement of the diaphragms 25, 26, 27 differs from the arrangement according to FIG. 3 in that they are not located in the entrance and exit planes of the spherical sectors. This embodiment also shows two-fold radial symmetry with respect to point Z.

Figure 7:
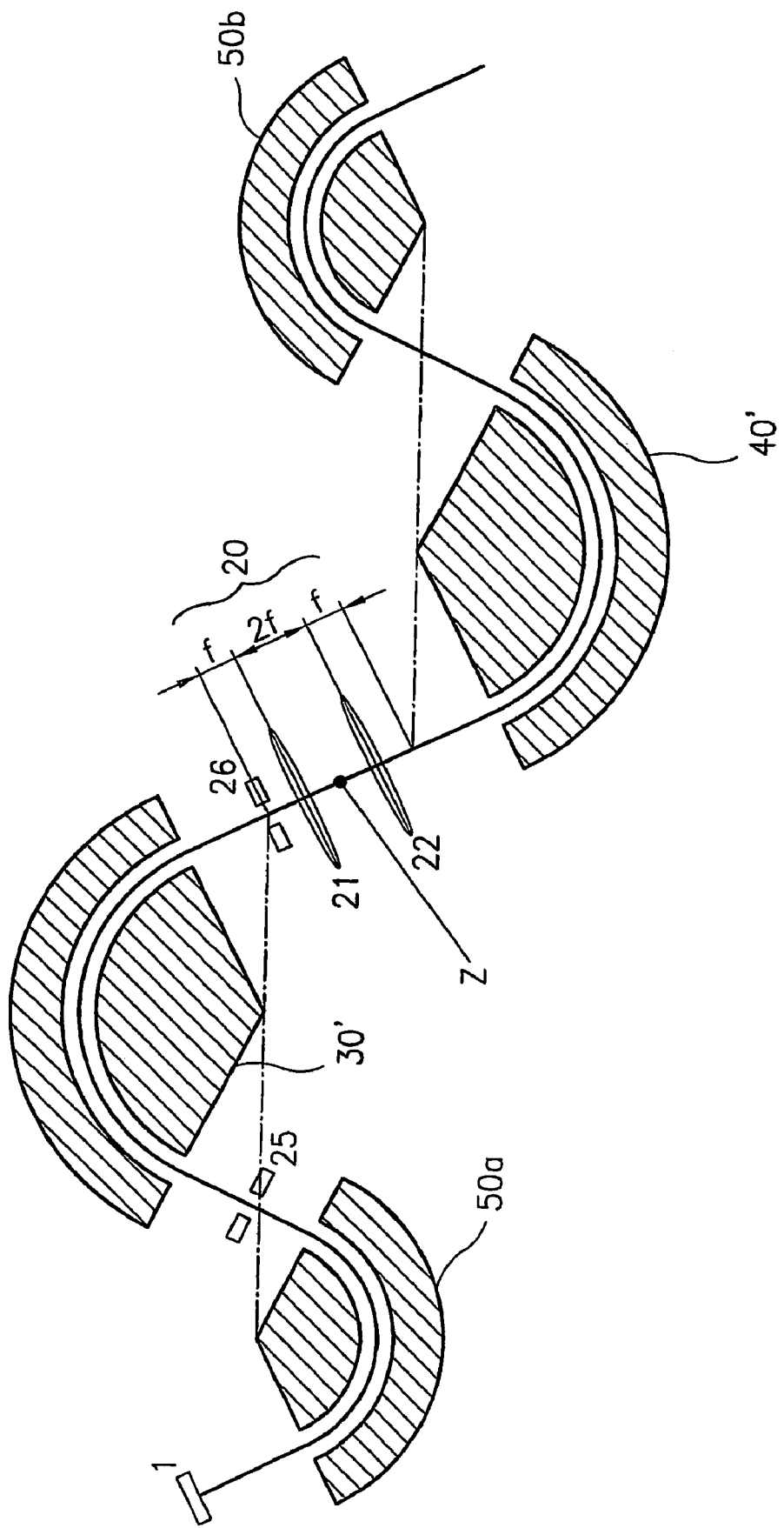
FIG. 7 shows another embodiment with a total of four toroidal sectors.

FIG. 7 shows the arrangement according to FIG. 6 supplemented by two additional toroid sectors 50a, 50b. The toroid sector 50a is placed in front of the first spherical sector 30', and the toroid sector 50b is placed behind the second spherical sector 40'. These additional toroid sectors 50a, 50b serve to correct higher-order aberrations.

Figure 8:
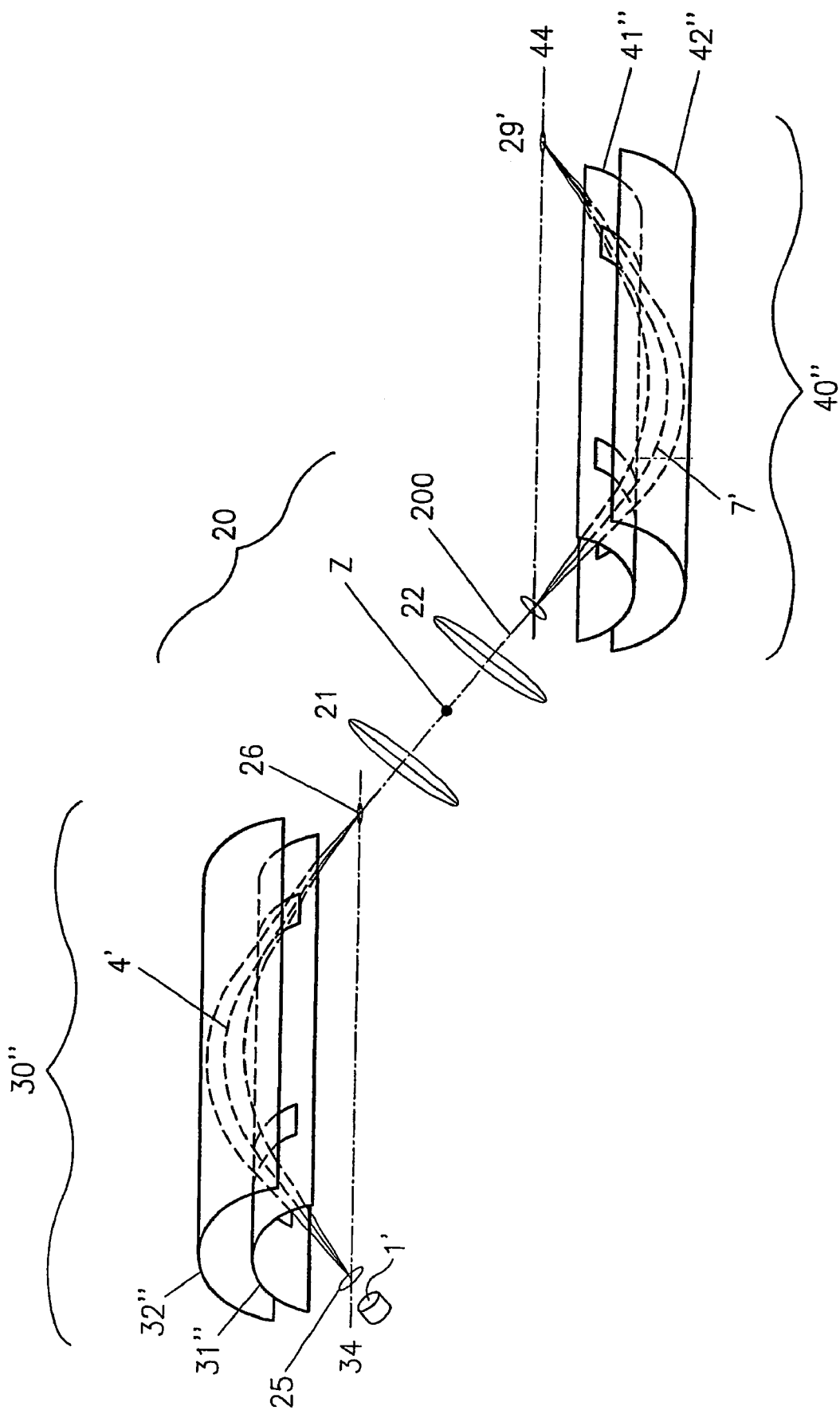
FIG. 8 shows an energy filter with cylindrical analyzers.

FIG. 8 shows an energy filter consisting of two cylindrical analyzers 30', 40' [Sic; →30", 40"-Tra] with inner shells 31", 41" and outer shells 32", 42" and a transfer lens device 20. The axis 200 of the transfer lens system 20 is not collinear to the cylinder axes 34, 44 but extends instead in the direction of the central paths 4', 7' through the cylindrical analyzers, which form an angle of 42.3° with the cylinder axes 34, 44.

FIGS. 9a and 9b show a transfer lens device 20 which avoids both spherical aberration and the coma error. This can be achieved by combining electrical or magnetic round lenses (21, 22) with two sextupole lenses 121, 122. The axis 200 of the transfer lens device extends in direction z.

FIG. 9a shows a cross section through a sextupole segment perpendicular to its axis. The force F on a particle changes its direction between two adjacent electrodes, the voltages U and $-U$ relative to the axis potential being applied to alternate electrodes.

FIG. 9b shows schematically the course of two electrons a certain distance away from the axis. At the point of entrance, the axes of these electrons are parallel in the xy cross section. The broken lines show the paths observed when the sextupoles 121 and 122 are turned off, and the solid lines show the path observed when they are turned on. The path near the axis is affected to only a slight extent by the sextupoles.

The sextupoles lie in the exit and entrance planes 5, 6 of the energy analyzers.

Figure 10:
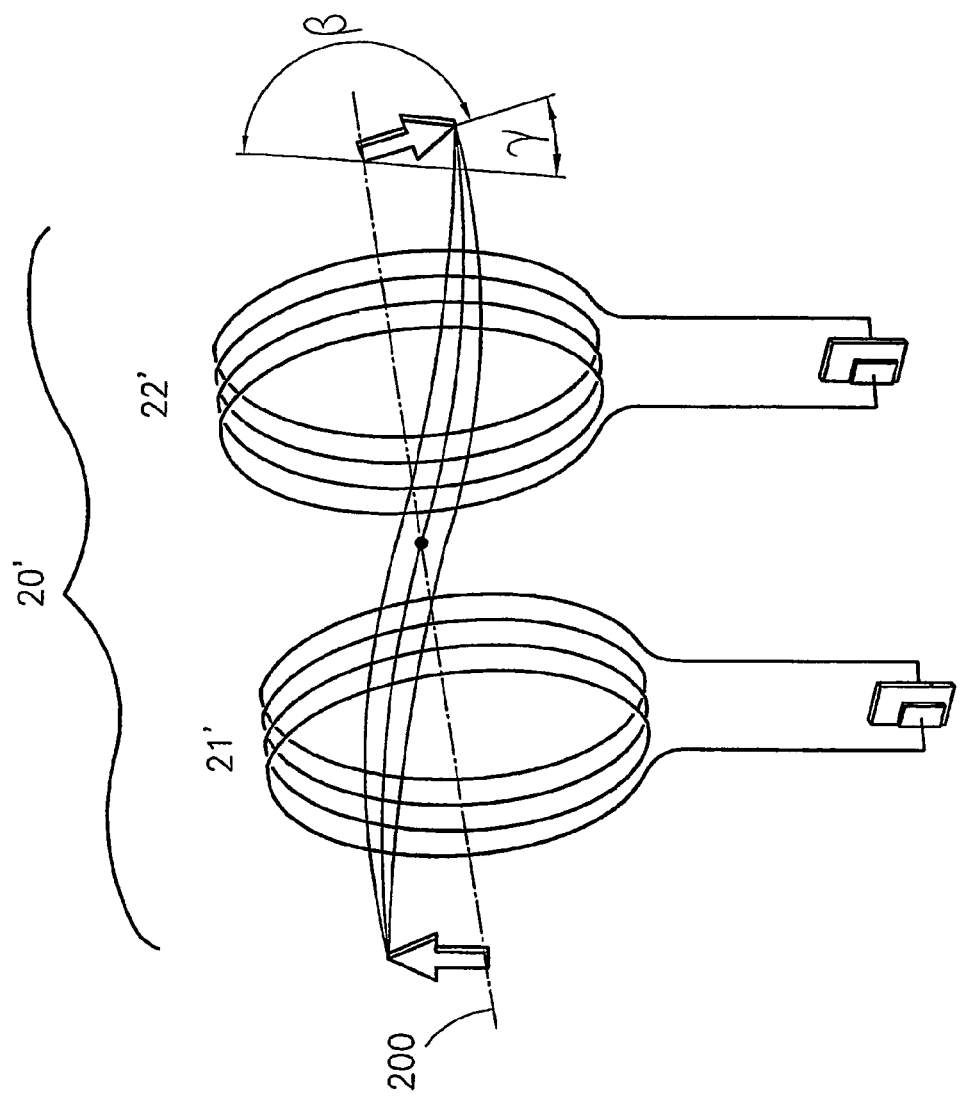
FIG. 10 shows a transfer lens device with magnetic lenses.

FIG. 10 shows a schematic diagram of a magnetic transfer lens device 20 [Sic →20'-Tra] analogous to the electrostatic lenses of FIG. 2. The magnetic fields of the lenses 22' and 21' are generated by coils. The essential difference between this and an electrostatic transfer lens device is an additional rotation of the image by the angle γ, where γ is based on the position of the image at $$V_L = -\frac{ZB_2}{ZB_1}.$$

| List of Reference Symbols | |
|---|---|
| 1 | sample |
| 1' | surface of sample |
| 2 | first lens system |
| 3 | entrance plane |
| 4, 4' | central beam bath in the first energy analyzer |
| 5 | exit plane |
| 6 | entrance plane |
| 7, 7' | central beam path in the second energy analyzer |
| 8 | exit plane |
| 9 | lens system |
| 10 | detector |
| 20, 20' | transfer lens device |
| 21, 21' | first transfer lens |
| 22, 22' | second transfer lens |
| 23 | first intermediate image |
| 24 | second intermediate image |
| 25 | first slit diaphragm |
| 26 | second slit diaphragm |
| 27 | third slit diaphragm |
| 28 | fourth slit diaphragm |
| 29 | image |
| 30, 30', 30" | first toroidal energy analyzer |
| 31, 31', 32" | inner shell |
| 32, 32', 32" | outer shell |
| 33 | energy-dispersive plane |
| 34 | axis |
| 40, 40', 40" | second toroidal energy analyzer |
| 41, 41', 41" | outer shell |
| 43 | energy-dispersive plane |
| 44 | axis |
| 50a, 50b | toroid sector |
| 121 | sextupole lens |
| 122 | sextupole lens |
| 200 | axis of the transfer lens device |

The invention claimed is:

1. Image-generating energy filter for electrically charged particles such as electrons and ions with at least two toroidal energy analyzers arranged in a row, where at least one energy analyzer has a diaphragm at its entrance plane and another diaphragm at its exit plane, characterized in that:
   a transfer lens device (20, 20') is located between the exit plate (5) of the first energy analyzer (30, 30', 30") and the entrance plane (6) of the second energy analyzer (40, 40', 40"), which device has negative lateral magnification $V_L$, negative angular magnification $V_W$, image rotation around the angle γ=β−180°, and a telescopic beam path, where its respective deflection angles φ are equal and its energy-dispersive planes (33, 43) are rotated around the angle β with respect to each other.

2. Energy filter according to claim 1, characterized in that the transfer lens device (20, 20') is designed so that, in the energy-dispersive plane (33), it projects the intermediate image $ZB_1$ (23) present at the exit plane (5) of the first energy analyzer (30, 30', 30") with a linear magnification of $$V_L = \frac{ZB_2}{ZB_1} < 0$$

and with an angular magnification of $$V_W = -\frac{\alpha_2}{\alpha_1} < 0 \text{ where } V_W V_L \sqrt{\frac{E_2}{E_1}} = 1,$$

rotated around the angle γ, onto the entrance plane (6) of the second energy analyzer (40, 40', 40") as intermediate image $ZB_2$ (24),
   where $\alpha_1$ is the exit angle of the charged particles from the exit plane (5) of the first energy analyzer (30, 30', 30"); $\alpha_2$ is the entrance angle to the entrance plane (6) of the second energy analyzer (40, 40', 40"); $E_1$ is the kinetic energy of the charged particles in the exit plane of the first energy analyzer (30, 30', 30"); and $E_2$ is the kinetic energy of the charged particles in the entrance plane of the second energy analyzer (40, 40', 40"), and
   where the charged particles in the transfer lens device (20, 20') pass through a telescopic beam path.

3. Energy filter according to claim 1, characterized in that the energy analyzers (30, 30', 30"; 40, 40', 40") and the transfer lens device (20) are arranged with radial symmetry around the center of the transfer lens device.

4. Energy filter according to claim 1, characterized in that the energy analyzers (30, 30', 30"; 40, 40', 40") are built with different dimensions.

5. Energy filter according to claim 1 characterized in that the energy analyzers are spherical sectors (30', 40'), hemispherical analyzers (30, 40), or cylindrical analyzers (30", 40").

6. Energy filter according to claim 5, characterized in that the energy-dispersive planes (33, 43) of the hemispherical analyzers (30, 40) are rotated around the axis (200) of the transfer lens device (20) by the angle β=180°, so that the beam path has a the shape of an "S".

7. Energy filter according to claim 1, characterized in that the transfer lens device (20) comprises at least one electrostatic tube lens (21, 22).

8. Energy filter according to claim 1, characterized in that the transfer lens device (20') comprises at least one magnetic lens.

9. Energy filter according to claim 1, characterized in that the transfer lens device (20) comprises at least one multipole lens (121, 122).

10. Energy filter according to claim 1, characterized in that the transfer lens device (20) has at least two lenses (21, 21') and (22, 22'), and in that the exit plane (5) of the first energy analyzer (30, 30', 30") is located at the focal point of the first lens (21, 21') and the entrance plane (6) of the second energy analyzer (40, 40', 40") is located at the focal point of the second lens (22, 22'), where the distance between the two lenses is 2F, where F stands for the focal distance of the lenses (21, 22, 21', 22').

11. Use of an energy filter according to claim 1 for electron microscopes.

12. Use of an energy filter according to claim 1 for time-resolved measuring instruments.

13. Energy filter according to claim 2, characterized in that the energy analyzers (30, 30', 30"; 40, 40', 40") and the transfer lens device (20) are arranged with radial symmetry around the center of the transfer lens device.

14. Energy filter according to claim 2, characterized in that the energy analyzers (30, 30', 30"; 40, 40', 40") are built with different dimensions.

15. Energy filter according to claim 2, characterized in that the energy analyzers are spherical sectors (30', 40'), hemispherical analyzers (30, 40), or cylindrical analyzers (30", 40").

16. Energy filter according to claim 2, characterized in that the energy-dispersive planes (33, 43) of the hemispherical analyzers (30, 40) are rotated around the axis (200) of the transfer lens device (20) by the angle β=180°, so that the beam path has a the shape of an "S".

17. Energy filter according to claim 2, characterized in that the transfer lens device (20) comprises at least one electrostatic tube lens (21, 22).

18. Energy filter according to claim 2, characterized in that the transfer lens device (20') comprises at least one magnetic lens.

19. Energy filter according claim 2, characterized in that the transfer lens device (20) comprises at least one multipole lens (121, 122).

20. Energy filter according to claim 2, characterized in that the transfer lens device (20) has at least two lenses (21, 21') and (22, 22'), and in that the exit plane (5) of the first energy analyzer (30, 30', 30") is located at the focal point of the first lens (21, 21') and the entrance plane (6) of the second energy analyzer (40, 40', 40") is located at the focal point of the second lens (22, 22'), where the distance between the two lenses is 2F, where F stands for the focal distance of the lenses (21, 22, 21', 22').

* * * * *